(12) United States Patent
Wittmer et al.

(10) Patent No.: US 8,988,896 B2
(45) Date of Patent: Mar. 24, 2015

(54) FIELD DEVICE FOR AUTOMATION TECHNOLOGY

(71) Applicant: Endress + Hauser Conducta Gesellschaft für Mess- und Regeltechnik mbH + Co. KG, Gerlingen (DE)

(72) Inventors: Detlev Wittmer, Maulbronn (DE); Ulrich Kaiser, Basel (CH)

(73) Assignee: Endress + Hauser Conducta Gesellschaft für Mess- und Regeltechnik mbH + Co. KG, Gerlingen (DE)

( * ) Notice: Subject to any disclaimer, the term of this patent is extended or adjusted under 35 U.S.C. 154(b) by 287 days.

(21) Appl. No.: 13/686,267

(22) Filed: Nov. 27, 2012

(65) Prior Publication Data

US 2013/0141888 A1 Jun. 6, 2013

(30) Foreign Application Priority Data

Dec. 1, 2011 (DE) .......................... 10 2011 087 588.3

(51) Int. Cl.
*H05K 9/00* (2006.01)
*H05K 7/14* (2006.01)

(52) U.S. Cl.
CPC .............. *H05K 7/14* (2013.01); *H05K 7/1462* (2013.01)
USPC ........... 361/818; 361/816; 361/817; 361/800; 174/350

(58) Field of Classification Search
CPC ...... H05K 7/1462; H05K 7/14; H05K 9/0037
USPC ............................ 361/800, 816–818; 174/350
See application file for complete search history.

(56) References Cited

U.S. PATENT DOCUMENTS

| 6,371,380 | B1 * | 4/2002 | Tanimura ....................... 235/492 |
| 6,373,711 | B2 * | 4/2002 | Yamauchi et al. ............ 361/752 |
| 6,377,218 | B1 * | 4/2002 | Nelson et al. ................. 343/702 |
| 6,424,263 | B1 * | 7/2002 | Lee et al. .................... 340/572.7 |
| 6,476,775 | B1 * | 11/2002 | Oberle ......................... 343/895 |
| 6,535,397 | B2 * | 3/2003 | Clark et al. ................... 361/788 |
| 6,839,032 | B2 * | 1/2005 | Teshirogi et al. ............. 343/702 |

(Continued)

FOREIGN PATENT DOCUMENTS

| DE | 102004050383 A1 | 4/2006 |
| DE | 102009028794 A1 | 2/2011 |

OTHER PUBLICATIONS

German Search Report, Aug. 29, 2012, Munich.

*Primary Examiner* — David M Sinclair
*Assistant Examiner* — Robert Brown
(74) *Attorney, Agent, or Firm* — Bacon & Thomas, PLLC

(57) ABSTRACT

A field device for automation technology, wherein the field device has a metal housing for accommodating a field device electronics, an RFID chip and a first RFID antenna for wireless communication and/or energy transmission between an RFID reading device arranged outside of the field device. The first RFID antenna is spaced from a neighboring wall of the metal housing, wherein shielding is provided between the first RFID antenna and the neighboring wall of the metal housing. The separation between the first RFID antenna and the wall of the metal housing and the shielding between the first RFID antenna and the neighboring wall of the metal housing are so dimensioned, that the metal housing does not prevent wireless communication and/or energy transmission between the RFID reading device and the field device.

13 Claims, 4 Drawing Sheets

(56) References Cited

U.S. PATENT DOCUMENTS

| | | | |
|---|---|---|---|
| 7,083,083 B2 * | 8/2006 | Droz | 235/375 |
| 7,315,248 B2 * | 1/2008 | Egbert | 340/572.7 |
| 7,336,186 B2 * | 2/2008 | Noguchi | 340/572.8 |
| 7,348,887 B1 * | 3/2008 | Warner et al. | 340/572.3 |
| 7,375,631 B2 * | 5/2008 | Moskowitz et al. | 340/572.1 |
| 7,398,926 B1 * | 7/2008 | Kikin et al. | 235/451 |
| 7,446,661 B2 * | 11/2008 | Bhogal et al. | 340/572.1 |
| 7,830,672 B1 * | 11/2010 | Kitchen | 361/818 |
| 7,911,806 B2 * | 3/2011 | Funato et al. | 361/818 |
| 7,922,094 B2 * | 4/2011 | Banerjee et al. | 235/492 |
| 7,938,334 B2 * | 5/2011 | Jesme et al. | 235/492 |
| 7,965,514 B2 * | 6/2011 | Hill et al. | 361/707 |
| 7,969,730 B1 * | 6/2011 | Doherty et al. | 361/679.54 |
| 8,134,846 B2 * | 3/2012 | Lang et al. | 361/818 |
| 8,351,221 B2 * | 1/2013 | Siomkos et al. | 361/818 |
| 8,461,992 B2 * | 6/2013 | Westrick et al. | 340/572.1 |
| 8,477,499 B2 * | 7/2013 | Hill et al. | 361/707 |
| 8,659,908 B2 * | 2/2014 | Adams et al. | 361/765 |
| 8,669,646 B2 * | 3/2014 | Tabatabai et al. | 257/659 |
| 8,767,407 B2 * | 7/2014 | Lim et al. | 361/753 |
| 8,804,344 B2 * | 8/2014 | Moncrieff | 361/748 |
| 8,848,394 B2 * | 9/2014 | Andrei | 361/818 |
| 2001/0048593 A1 * | 12/2001 | Yamauchi et al. | 361/807 |
| 2005/0160797 A1 * | 7/2005 | Schmitteckert | 73/49.8 |
| 2006/0067070 A1 * | 3/2006 | Otsuki | 361/816 |
| 2006/0244565 A1 * | 11/2006 | Friedrich et al. | 340/10.1 |
| 2007/0262867 A1 * | 11/2007 | Westrick et al. | 340/572.7 |
| 2008/0041930 A1 * | 2/2008 | Smith et al. | 235/375 |
| 2008/0231836 A1 * | 9/2008 | Curello et al. | 356/72 |
| 2009/0016685 A1 * | 1/2009 | Hudgins et al. | 385/92 |
| 2009/0086462 A1 * | 4/2009 | Funato et al. | 361/818 |
| 2009/0296361 A1 * | 12/2009 | Huang et al. | 361/783 |
| 2009/0314842 A1 * | 12/2009 | Charrin | 235/492 |
| 2010/0014270 A1 * | 1/2010 | Liu | 361/818 |
| 2010/0103058 A1 * | 4/2010 | Kato et al. | 343/702 |
| 2010/0182764 A1 * | 7/2010 | Phillips | 361/816 |
| 2010/0224401 A1 * | 9/2010 | Lin et al. | 174/377 |
| 2011/0050164 A1 * | 3/2011 | Partovi et al. | 320/108 |
| 2011/0068178 A1 * | 3/2011 | Gebhart | 235/492 |
| 2011/0069027 A1 * | 3/2011 | Kim et al. | 345/173 |
| 2011/0155445 A1 * | 6/2011 | Kwon et al. | 174/384 |
| 2011/0157859 A1 * | 6/2011 | Lehmann | 361/816 |
| 2011/0188220 A1 * | 8/2011 | Blackwell et al. | 361/802 |
| 2011/0188815 A1 * | 8/2011 | Blackwell et al. | 385/88 |
| 2011/0205028 A1 * | 8/2011 | Pagani et al. | 340/10.1 |
| 2011/0228492 A1 * | 9/2011 | Haq et al. | 361/750 |
| 2011/0254665 A1 * | 10/2011 | Lindsay et al. | 340/10.5 |
| 2011/0261551 A1 * | 10/2011 | Chirila et al. | 361/818 |
| 2011/0262305 A1 * | 10/2011 | Visinoni et al. | 422/68.1 |
| 2011/0267795 A1 * | 11/2011 | Kim et al. | 361/818 |
| 2011/0318590 A1 * | 12/2011 | Maki et al. | 428/461 |
| 2012/0147573 A1 * | 6/2012 | Lim et al. | 361/753 |
| 2012/0250267 A1 * | 10/2012 | Lee et al. | 361/748 |
| 2012/0273322 A1 * | 11/2012 | MacKay et al. | 194/210 |
| 2013/0050035 A1 * | 2/2013 | Kato et al. | 343/741 |

* cited by examiner

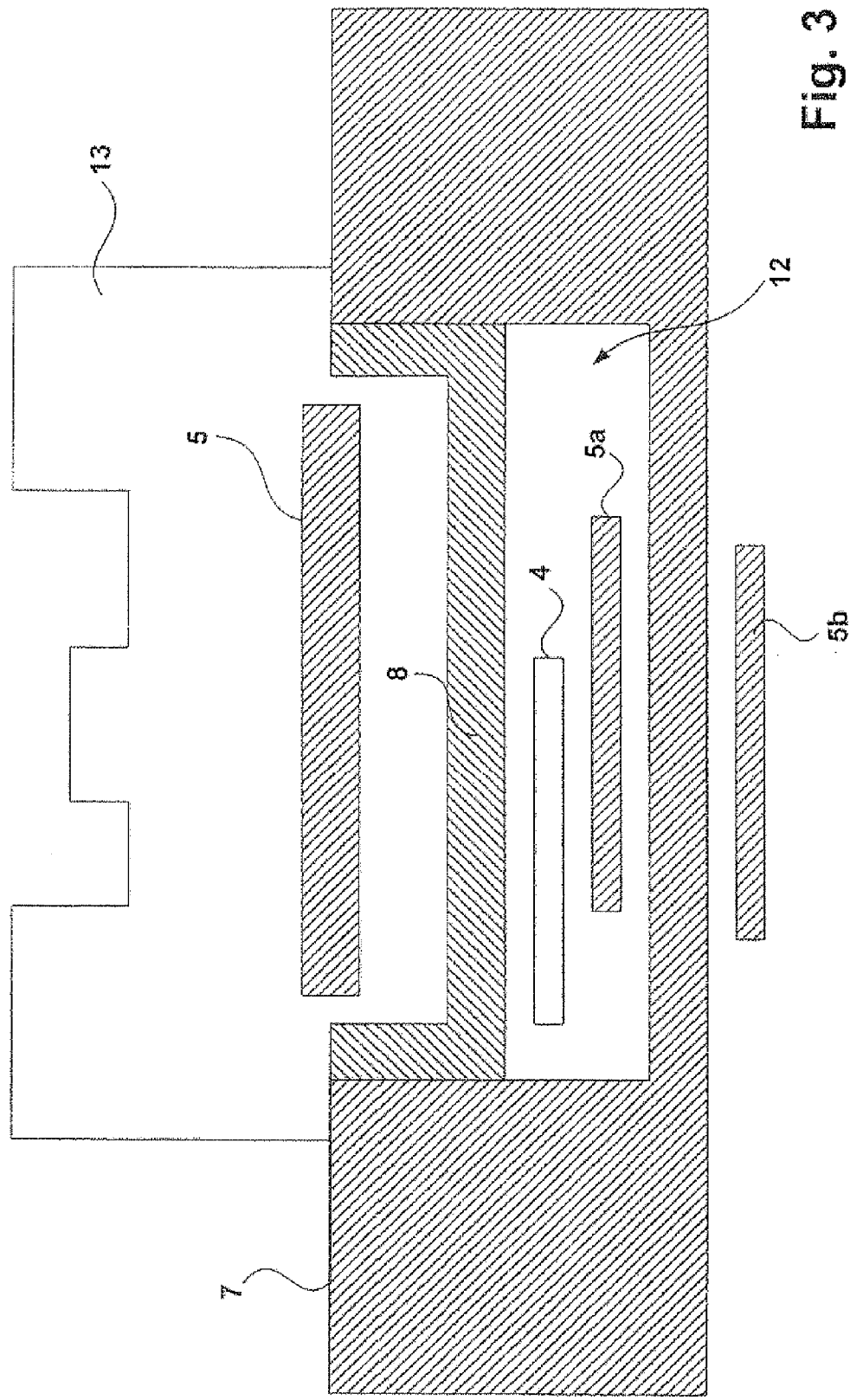

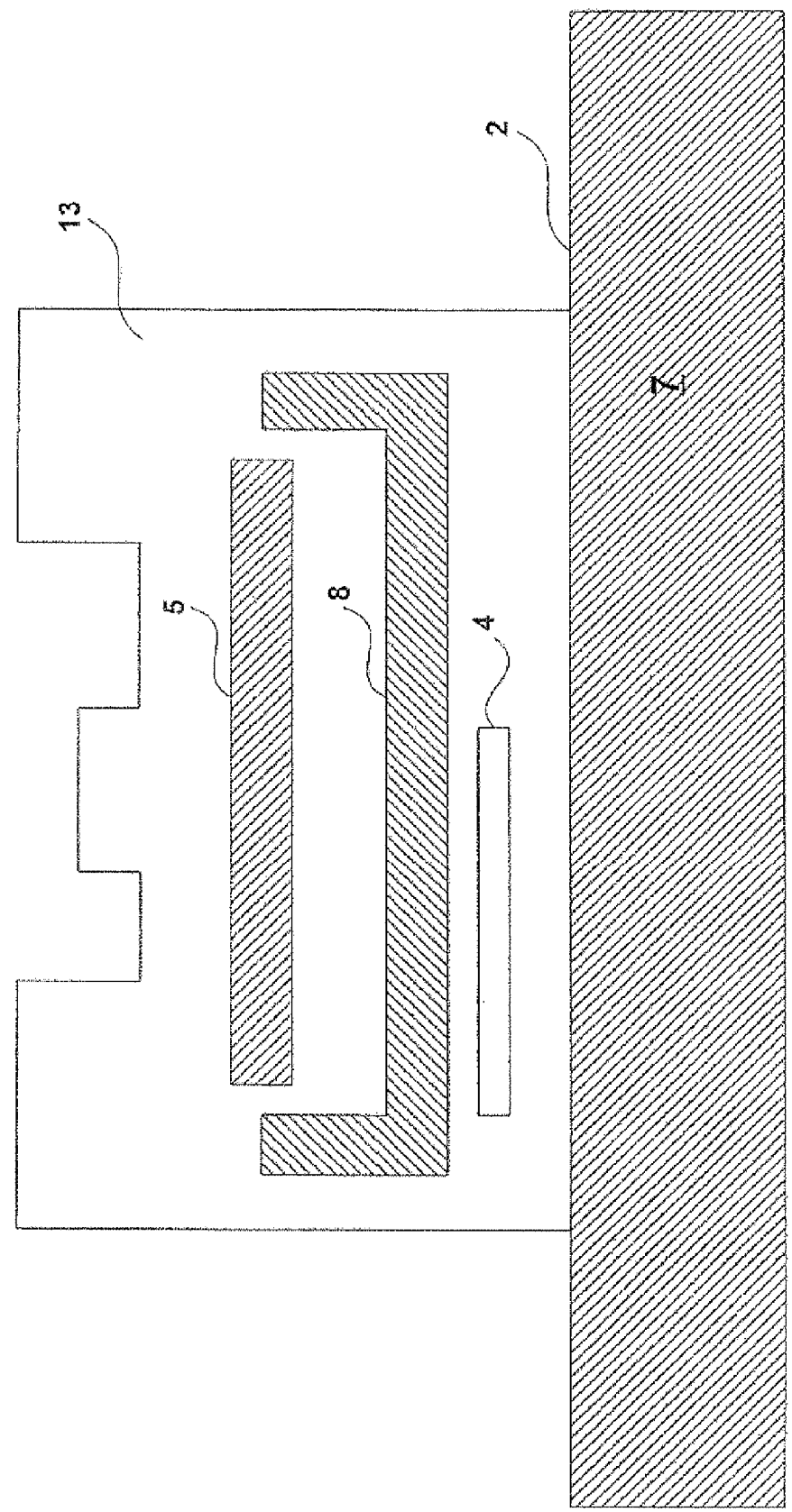

FIELD DEVICE FOR AUTOMATION TECHNOLOGY

TECHNICAL FIELD

The invention relates to a field device for automation technology.

BACKGROUND DISCUSSION

It is known to use RFID "Radio Frequency Identification" transponders—often also referred to as RFID tags or radio tags—e.g. in the field of logistics for identifying products and assemblies of products.

RFID tags enable automatic identification and locating of objects and facilitate therewith significantly the registering and providing of information and data. An RFID system is composed of an RFID transponder, or an RFID tag, which is associated with an object and includes the more relevant information and data, and a reading device for read-out of the information and data. Coupling between RFID tag and reading device occurs via short range, magnetic, alternating fields or high frequency radio waves of greater range produced by the reading device. Data transmission occurs via the alternating fields or the high frequency radio waves produced by the reading devices. In many cases, the chip is also supplied with energy via the alternating fields or the high frequency radio waves.

RFID transponders/RFID tags include an RFID chip and an RFID antenna and differ as a function of transmission frequency, manufacturer and purpose of use. The RFID chip is usually composed of an analog circuit for receiving and sending data, a digital circuit and a memory, which usually can be over-written multiple times. The digital circuit is often implemented via a microcontroller. In the case of a passive RFID chip, the energy received during communication via the antenna serves for the energy supply of the microcontroller. In the case of active RFID tags, the energy supply of the microcontroller occurs via its own installed energy source, e.g. a single-use battery. In the case of half active RFID tags, the installed energy source supplies only the digital circuit, e.g. the microcontroller.

RFID tags work, depending on type, in the long wave region at 125-134 kHz, the short wave region at 13.56 MHz, the UHF region at 865-869 MHz. or 950 MHz or the SHF region at 2.45 GHz and 5.8 GHz.

The activated microcontroller in the RFID tag decodes commands sent by the reading device. The reading device codes the response and modulates it into the radiated electromagnetic field by field weakening in contact free, short circuit (load modulation) or in opposite phase reflection of the alternating field sent by the reading device (modulated back scattering). The RFID tag transmits, for example, its own unchangeable serial number, the information and data of the associated object, etc. The RFID tag thus itself produces no field; rather, it influences the electromagnetic transmission field of the reading device.

In the case of field devices of automation technology with metal housing, the metal housing material effects a shielding of the electromagnetic data- and/or energy transmission, whereby the transmission path is usually limited to a few centimeters and therewith to the close proximity of the field device. The use of RFID technology in the field of automation technology is limited to a few special cases. A general use, or retrofitting, of field devices with RFID technology is, so far, not possible.

SUMMARY OF THE INVENTION

An object of the invention is to provide a field device of automation technology with an RFID functionality.

The object is achieved by features including that the field device has a metal housing for accommodating a field device electronics, that an RFID chip and a first RFID antenna for wireless communication and/or energy transmission between an REID reading device arranged outside of the field device and the field device are provided, that the first RFID antenna is spaced from a neighboring wall of the metal housing, wherein shielding is provided between the first RFID antenna and the neighboring wall of the metal housing, that the separation between the first RFID antenna and the wall of the metal housing and the shielding between the first RFID antenna and the neighboring wall of the metal housing are so dimensioned, that the metal housing does not prevent wireless communication and/or energy transmission between the RFID reading device and the field device. The different types of RFID tags applicable in connection with the invention are those mentioned above. In given cases, a suitable spacer material is arranged between the shielding and the first RFID antenna.

An advantageous further development of the method of the invention provides that the metal housing has an opening, which is closable via a cable guide, and wherein the first RFID antenna is integrated into the cable guide. In this regard, it is especially advantageous, when also the RFID chip is integrated into the cable guide. In such case, it is provided that the cable guide is connected with the field device, for example, via a Pg screw connection, a screw connection with metric thread, or via a nut. In the case of this embodiment, a cable guide already provided in almost every field device is provided as location for the RFID tag.

An embodiment of the field device of the invention provides that internal communication and/or energy transmission between the first RFID antenna integrated into the cable guide and the field device electronics occurs by wire. Alternatively, it is provided that a second RFID antenna is arranged in the cable guide in such a manner that it enables wireless communication with the field device electronics.

Moreover, it is provided that the metal housing has a recess in a housing region, in which the RFID antenna is arranged. Preferably, this recess is dimensioned in such a manner that the surfaces of the metal housing and the first RFID antenna, or a coating arranged on the RFID antenna, terminate essentially (lushly with one another. The recess in the surface of the metal housing is achieved, for example, either by deep drawing or by removal of housing material in the region, in which the RF antenna is to be arranged.

In connection with the solution of the invention, furthermore, a third RFID antenna is provided on an inner side of the recess facing the field device electronics.

It is, moreover, especially advantageous, when a company logo embodied in the form of a relief is arranged on the metal housing, or in the recess of the metal housing, wherein the RFID antenna can be arranged in the relief of the company identifier or under the company identifier.

Moreover, it is provided that the frequency used for communication or energy transmission between the first RFID antenna and the external reading device is higher than the frequency used between the second RFID antenna and the field device electronics. This embodiment makes use of the physical principle that the penetration depth of alternating fields, or radio waves, depends on frequency. While the internal communication is near range, the range for external communication should lie around 1 m. An advantageous embodiment of the field device of the invention provides, thus, that the RFID chip supplementally performs the task of a gateway.

Furthermore, it is provided that there is associated with the RFID chip a non volatile memory region, in which relevant field device data are stored, wherein these field device data, in a case, in which the energy supply to the field device is interrupted, can be read out via the external reading device. The stored data, especially parametering/configuration data, can subsequently be taken over into the replacement device. In this regard, one speaks of the cloning of a field device. In general, the stored data is e.g. name plate data of the field device, information concerning hardware- and/or software components of the field device, data (such as measurement data, diagnostic data, counter reading, etc.) stored before the interruption of the energy supply to the field device and/or the above mentioned configuration/parameter data.

BRIEF DESCRIPTION OF THE DRAWINGS

The invention will now be explained in greater detail based on the appended drawing, the figures of which show as follows:

FIG. 3 a further development of the embodiment shown in FIG. 2, wherein a company logo is arranged above the RFID components; and FIG. 4 a section of a third embodiment of the field device of the invention, in the case of which the RFID components are integrated into a company logo.

DETAILED DISCUSSION IN CONJUNCTION WITH THE DRAWINGS

Figure 1:
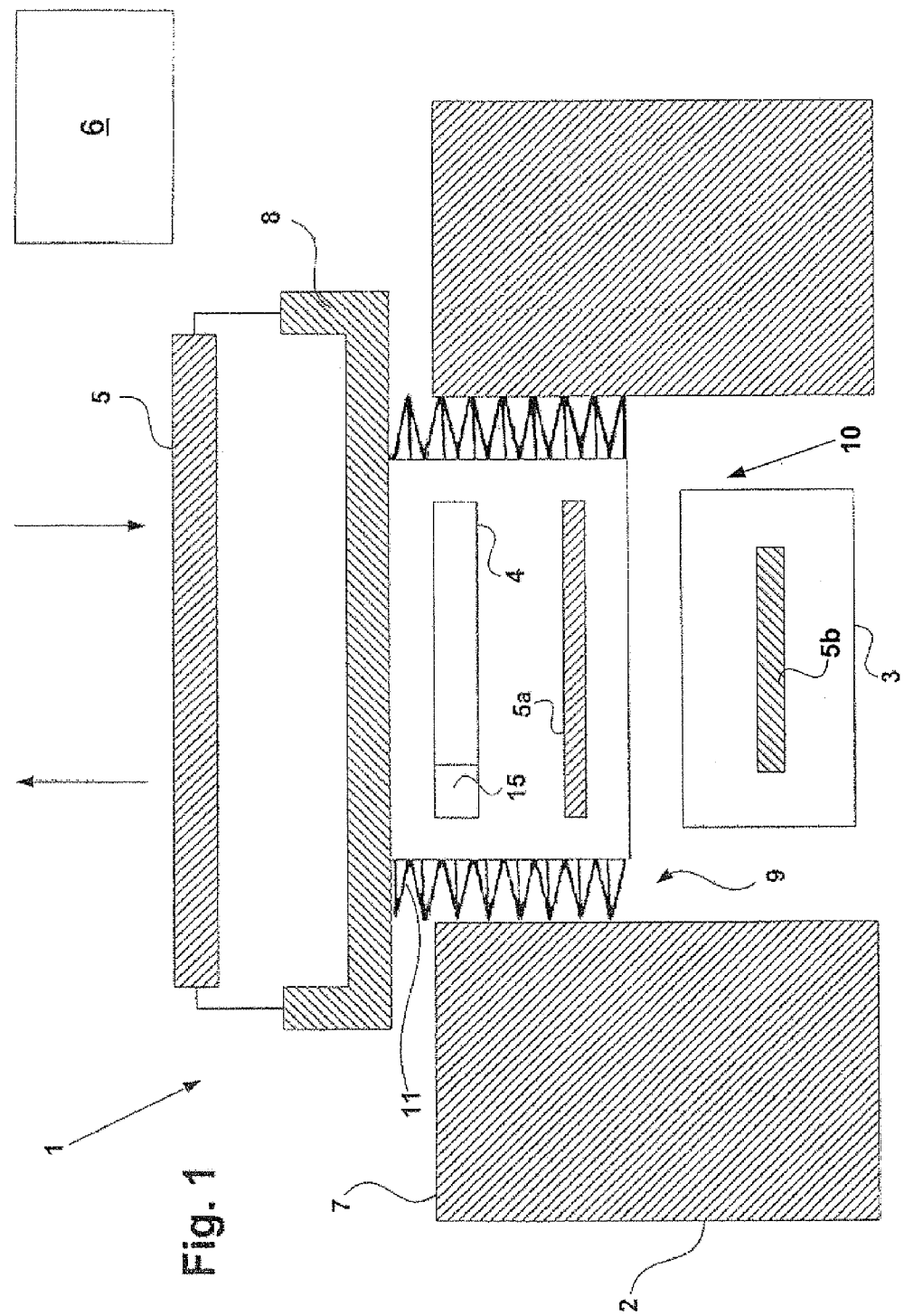
FIG. 1 a section of a first embodiment of the field device of the invention, in the case of which the RFID components are arranged in the region of the cable guide of the field device.

Field devices installed in automation technology, especially process- and manufacturing, automation technology, serve for registering and/or influencing process variables. Serving for registering process variables are sensors, such as, for example, fill level measuring devices, flow measuring devices, pressure- and temperature measuring devices, pH-redox potential measuring devices, conductivity measuring devices, etc., which register the corresponding process variables, fill level, flow, pressure, temperature, pH-value, and conductivity, respectively. Serving for influencing process variables are actuators, such as, for example, valves or pumps, via which the flow of a liquid in a pipeline section, or the fill level in a container, can be changed. Referred to as field devices are, in principle, however, all devices, which are applied near to the process and which deliver, or process, process relevant information. Thus, understood to be field devices in connection with the invention are also remote I/Os, radio adapters, or, generally, devices, which are arranged at the field level. A large number of such field devices are produced and sold by the firm, Endress+Hauser.

Wired field devices 1, in the case of which communication with and energy supply from a superordinated control unit (not separately illustrated in FIG. 1) occur either via a two-wire cable or via one of the fieldbusses (Fieldbus Foundation, Profibus Pa., HART, etc) customary in automation technology, have in the metal housing 2 an opening 9, into which an electrical cable guide 10 can be integrated, wherein the cable guide then loses the function of cable guiding. Cable guide 10 and housing 2 are so embodied that the field device 1 is adapted optimally to the process variables (temperature, pressure, etc.) reigning in the process and to things present in the process (potential for danger due to the medium to be determined, or to be monitored, in the process).

FIG. 1 shows a first embodiment of the field device 1 of the invention, in the case of which the RFID components 4, 5 are arranged in the region of the cable guide 10 of the field device 1. The RFID components integrated into the cable guide 1. include especially the first RFID antenna 5, via which communication with the reading device 6 occurs, and, depending on embodiment, the RFID chip 4 and its associated memory unit 15.

Furthermore, there can be integrated into the cable guide 10 a second RFID antenna 5a, via which, on the one hand, internal communication with a third antenna 5b, which is associated with the field device electronics 3, occurs, and via which, on the other hand, communication with the first RFID antenna 5 also takes place. In the case of this embodiment, communication between the field device electronics 3 and the reading device 6 thus occurs completely wirelessly, for example, via radio waves. Of course, communication between the first RFID antenna 5 and the field device electronics 3 can also occur via wire (not shown), wherein leading the wire in the cable guide 10 is without problem due to the integration of the RFID components into the cable guide 10.

Via so-called close coupling, thus internal communication with the field device electronics 3—for the case, in which communication occurs completely wirelessly—even dynamic data, which are stored in the field device electronics 3, can be read-out in the unpowered state of the field device 1. Advantageous in such case is furthermore galvanic isolation between the RFID components 4, 5 and the field device electronics 3. In the case of this so-called near field communication, the RFID electronics of the RFID chip 4 can, moreover, work as a gateway. Especially, there can be used for the external and internal communications different frequencies, which are matched optimally to the particular application (internal or external communication).

In order to keep the influence of the metal wall 7 small, especially as regards the external radio transmission by means of RFID technology, two measures are implemented according to the invention: The first RFID antenna 5 is spaced from the neighboring wall 7 of the metal housing 2, and, supplementally, shielding 8 is provided between the first RFID antenna 5 and the neighboring wall 7 of the metal housing 2. Shielding 8 is composed preferably of ferromagnetic material. The separation between the first RFID antenna 5 and the wall 7 of the metal housing 2 and the thickness and type of shielding 8 between the first RFID antenna 5 and the neighboring wall 7 of the metal housing 2 are so dimensioned that the metal housing 2 does not prevent, at least not completely prevent, wireless communication and/or energy transmission between the RFID reading device 6 and the field device 1. The arrangement is especially so embodied that the external radio transmission via RFID technology is possible up to a predetermined distance. Preferably, such distance amounts to about 1 m. According to the invention, thus, transmitting- and receiving efficiencies are increased compared with conventional solutions with RFID tags.

Cable guide 10 is emplaced in a corresponding opening 9 of the metal housing 2. The cable guide 10 is connected with the housing 2 of the field device 1 either via a Pg screw connection 11 or a nut. The second variant with the nut is not shown in FIG. 1.

Associated with the RFID chip 4 is a memory unit 15, which has a preferably non-volatile memory region, in which relevant field device data are stored. Depending on the type of stored data, these are permanently present (e.g. the serial number of the field device 1, and information concerning hard- and/or software components of the field device 1) or they are, in given cases, over-written at predetermined intervals or upon occurrence of a predetermined event, so that, for example, the last changed parametering/configuration data are available in the memory unit 15. If the power supply to the field device 1 is interrupted (for instance, in the case of total failure of the field device 1 or in the case of device replacement), then an option is to read out the stored data via the external reading device 6. Then, the data can be transmitted into the replacement device, so that manual parametering of the substitute device can be omitted. This option is available in the case of all embodiments of the field device 1 of the invention.

Although it is always a reading device 6 that is spoken of, it is, of course, also possible to write data from the reading device 6 into the field device 1, or into a replacement device.

Figure 2:
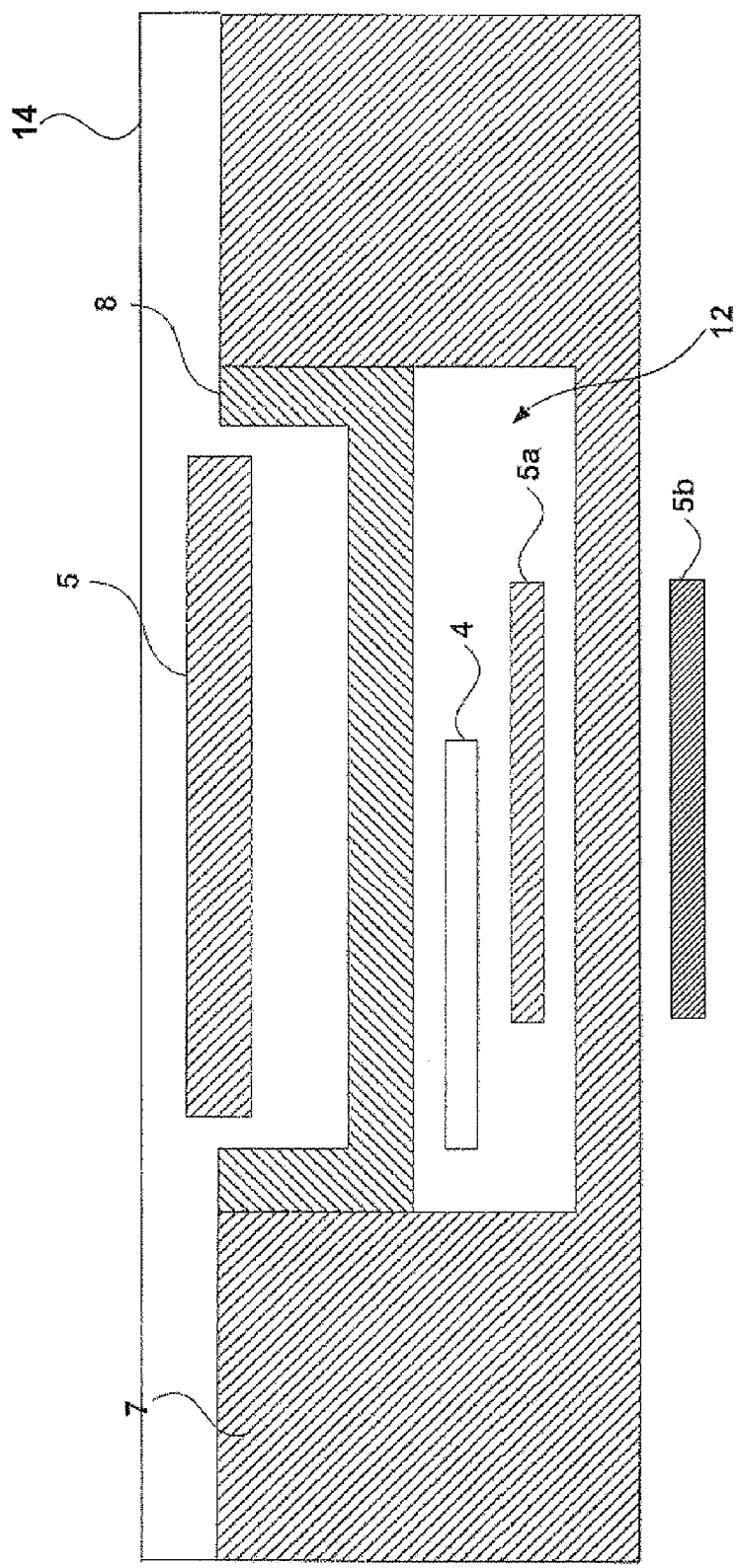
FIG. 2 a section of a second embodiment of the field device of the invention, in the case of which the RFID components are integrated into the metal housing.

FIG. 2 shows a second embodiment of the field device 1 of the invention, in the case of which the RFID components 4, 5 are integrated into the metal housing 2. In subsequent descriptions of figures, only differences relative to the embodiment of FIG. 1 are described in detail.

In the case of this embodiment, wall 7 of the metal housing 2 has a recess 12 in a housing region, in which the first RFID antenna 5 is arranged for the external communication with a reading device 6 (not shown in FIG. 2). Cavity 12 is formed either via a deep draw process or via removal of material from the wall 7 of the housing 2. Preferably, recess 12 is dimensioned in such a manner that the surfaces of the metal housing 2 and the first RFID antenna 5, or a coating 14 on the RFID antenna 5, are essentially flush with one another. Coating 14 serves to protect the RFID antenna 5 and seals recess 12 from the environment. Coating 14 comprises a non-metallic material. In the case of this embodiment, the antennas 5a, 5b for internal communication with the field device electronics 3 are arranged in the immediate vicinity, and on both sides, of the housing region containing recess 12.

FIG. 3 shows a further development of the embodiment shown in FIG. 2. Here, there is arranged above the RFID components 4, 5 a company identifier, e.g. a company logo, embodied in the form of a relief 13. Here, the relief 13 of the company identifier performs furthermore the function of a protective layer 14. Since the company logo, or the company identifier, is usually placed at an exposed, outwardly well visible and electromagnetically optimum position, it is simultaneously assured that the external communication is not disturbed by the installation of the field device 1 into the process.

In the case of the third embodiment of the field device 1 of the invention illustrated in FIG. 4, the RFID components 4,5 are integrated into the company identifier embodied in the form of relief 13. This embodiment has, same as the embodiment, in the case of which the RFID components 4, 5 are integrated into the cable guide 10, the advantage that the solution of the invention can be built into a conventional field device. A field device 1 can, thus, be retrofitted with RFID technology.

The invention claimed is:

1. A field device for automation technology, comprising:
   field device electronics;
   a metal housing for accommodating said field device electronics;
   an RFID chip;
   an external RFID reading device arranged outside of the field device and
   a first RFID antenna for wireless communication and/or energy transmission between said RFID reading device and the field device, wherein:
   said first RFID antenna is spaced of a neighboring wall of the metal housing;
   shielding is provided between said first RFID antenna and said neighboring wall of the metal housing;
   the separation between said first RFID antenna and said neighboring wall of said metal housing and said shielding between said first RFID antenna and said neighboring wall of said metal housing are so dimensioned, that said metal housing does not prevent wireless communication and/or energy transmission between said external RFID reading device and the field device.

2. The field device as claimed in claim 1, wherein:
   said metal housing has an opening, which is closable via a cable guide, and wherein said first RFID antenna is integrated into said cable guide.

3. The field device as claimed in claim 2, wherein:
   said RFID chip is integrated into said cable guide.

4. The field device as claimed in claim 2, wherein:
   communication and/or energy transmission between said first RFID antenna integrated into said cable guide and said field device electronics occurs by wire.

5. The field device as claimed in claim 2, further comprising:
   a second RFID antenna arranged in said cable guide in such a manner that it enables wireless communication with said field device electronics.

6. The field device as claimed in claim 5, wherein:
   the frequency used for communication, or energy transmission between said first RFID antenna and said external reading device is higher than the frequency used between said second RFID antenna and said field device electronics.

7. The field device as claimed in claim 2, wherein:
   said cable guide is connected with the field device via a Pg screw connection or via a nut.

8. The field device as claimed in claim 1, wherein:
   said metal housing has a recess in a housing region, in which said RFID antenna is arranged.

9. The field device as claimed in claim 8, wherein:
   said recess is dimensioned in such a manner that the surfaces of said metal housing and said first RFID antenna, or a coating arranged on said RFID antenna terminate essentially flushly with one another.

10. The field device as claimed in claim 8, further comprising:
    a third RFID antenna provided on an inner side of said recess facing said field device electronics.

11. The field device as claimed in claim 8, wherein:
    a company identifier embodied in the form of a relief is arranged on said metal housing, or in said recess of said metal housing; and
    said first RFID antenna is arranged in said relief of the company identifier or under the company identifier.

12. The field device as claimed in claim 1, wherein:
    said RFID chip supplementally performs the task of a gateway.

13. The field device as claimed in claim 1, wherein:
    there is associated with said RFID chip a non volatile memory region, in which relevant field device data are stored, wherein these field device data, in a case, in which the energy supply to the field device is interrupted, can be read out via said external reading device.

* * * * *